United States Patent
Yamada

[19]

[11] Patent Number: 5,397,942
[45] Date of Patent: Mar. 14, 1995

[54] DRIVER CIRCUIT FOR A PLURALITY OF OUTPUTS

[75] Inventor: Masao Yamada, Tokyo, Japan

[73] Assignee: NEC Corporation, Tokyo, Japan

[21] Appl. No.: 933,709

[22] Filed: Aug. 24, 1992

[30] Foreign Application Priority Data

Aug. 23, 1991 [JP] Japan ................... 3-237361

[51] Int. Cl.⁶ .............. H03K 19/096; H03K 17/16; G11C 19/28
[52] U.S. Cl. .................... 326/82; 377/68; 377/80; 327/93; 327/21; 327/108
[58] Field of Search ............ 307/542, 542.1, 443, 307/480; 377/68, 78, 80, 81

[56] References Cited

U.S. PATENT DOCUMENTS

| | | | |
|---|---|---|---|
| 4,057,738 | 11/1977 | Nishimura | 307/542.1 |
| 4,185,210 | 1/1980 | Zuk | 307/542.1 |
| 4,284,953 | 8/1981 | Hepworth et al. | 377/81 |
| 4,349,754 | 9/1982 | Bull | 307/443 |
| 4,417,155 | 11/1983 | Aizawa | 307/542.1 |
| 4,479,065 | 10/1984 | Aizawa | 307/542.1 |
| 4,775,840 | 10/1988 | Ohmori et al. | 307/443 |
| 5,122,694 | 6/1992 | Bradford et al. | 307/480 |

FOREIGN PATENT DOCUMENTS 2179115 7/1990 Japan ................... 307/542.1

OTHER PUBLICATIONS

Texas Instruments Display Driver Handbook, D2715, pp. 3-91 to 3-94, Mar. 1983.

*Primary Examiner*—Edward P. Westin
*Assistant Examiner*—Benjamin D. Driscoll
*Attorney, Agent, or Firm*—Sughrue, Mion, Zinn, Macpeak & Seas

[57] ABSTRACT

A driver circuit in an integrated circuit includes a flip-flop circuit and a plurality of AND gates. The flip-flop circuit causes an external control signal which is supplied externally to synchronize with a clock signal, and produces an internal control signal. The AND gates control a plurality of outputs based on a data signal in accordance with the internal control signal. Since the internal control signal is synchronized with the clock signal, changes in the outputs from the AND gates are delayed from the timing of the clock signal. Thus, it is possible to prevent the occurrence of malfunction caused by a switching current to flow in transient of changes in the outputs.

3 Claims, 4 Drawing Sheets

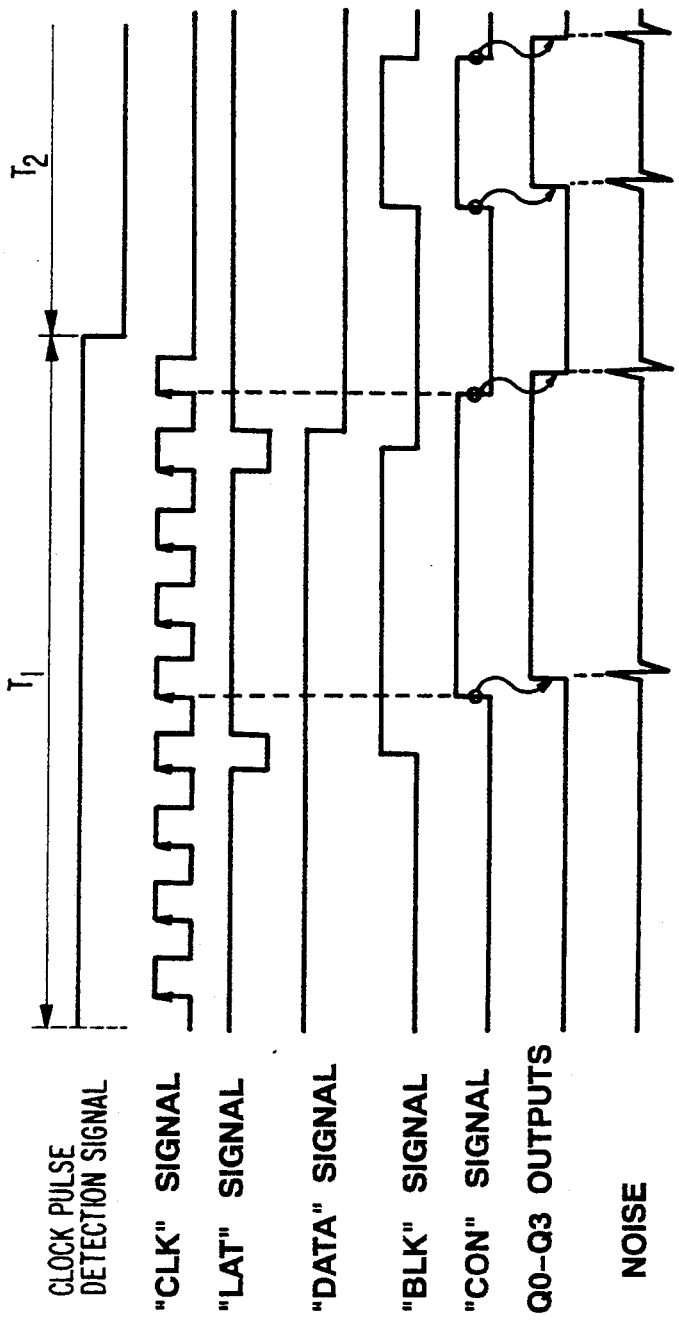

DRIVER CIRCUIT FOR A PLURALITY OF OUTPUTS

BACKGROUND OF THE INVENTION (1) Field of the Invention

The present invention relates to a driver circuit of an integrated circuit for driving light emitting elements such as light emitting diodes (LED) or fluorescent display elements, and more particularly to a driver circuit having a plurality of driving outputs.

(2) Description of the Prior Art

A conventional driver circuit of the kind to which the present invention relates is shown by a block diagram in FIG. 1. As shown therein, a 4-bit shift register 1 is provided with a DATA terminal for receiving a data signal (hereinafter referred to as "DATA signal") and a CLK terminal for receiving a clock signal (hereinafter referred to as "CLK signal"), and outputs an output signal of 4-bits in synchronization with the CLK signal. A 4-bit latch 2 is provided with a LAT terminal for receiving a latch signal (hereinafter referred to as "LAT signal"), and latches the 4-bit output signal outputted from the shift register 1 in response to the LAT signal. There are four AND gates 3 each having two input terminals to one of which a blank signal (hereinafter referred to as "BLK signal") is externally inputted as an external control signal and to the other of which the output signal from the latch 2 is inputted. The respective AND gates 3 perform logical AND operations on the two inputted signals and output their output signals from respective output terminals $Q_0$ through $Q_3$.

The operation of the conventional driver circuit described above is explained with reference to a timing chart shown in FIG. 2. The DATA signal serially inputted to the DATA terminal is loaded in or inputted to the 4-bit shift register 1 in response to the respective leading edges of the CLK signal, and is parallelly outputted from the 4-bit shift register 1. The output signals from the 4-bit shift register 1 are latched by the 4-bit latch 2 when the LAT signal is at a "High" level (hereinafter referred to as "H"), and are supplied to the AND gates 3. When the BLK signal is at a "low" level (hereinafter referred to as "L"), since the AND gates 3 are in their OFF state, the output signals from the output terminals $Q_0$–$Q_3$ are always at "L". Contrary to the above, when the BLK signal turns to "H", since the AND gates 3 become ON, the output signals from the latch 2 are transferred to the output terminals $Q_0$–$Q_3$ through the AND gates 3. In this case, when the BLK signal turns to "H", the output signals from the output terminals $Q_0$–$Q_3$ change from "L" to "H" and, when the BLK signal turns to "L", the output signals from the output terminals $Q_0$–$Q_3$ change from "H" to "L". Consequently, during the transient state of changes in the output signals from the output terminals $Q_0$–$Q_3$, there flows a switching current which causes noise to be produced in signal lines. This switching current is proportional to the number of the outputs so that, where the number of the outputs is N, such current is N times the switching current of a single output.

In the conventional driver circuit, a large switching current to flow during the transient state of changes in the outputs from the output terminals $Q_0$–$Q_3$ causes a voltage drop due to wiring resistance, so that the potentials of the power source voltage and the ground line which are inherently constant become unstable or unavoidably fluctuate. Here, since the BLK signal which is used such as for controlling the luminance of an LED or a fluorescent display element is supplied independently from or asynchronously with the CLK signal, there is a possibility for the potential fluctuations of the power source voltage and the ground line to overlap the leading edge timings of the CLK signal. The overlapping or coincidence of the potential fluctuations of the power source voltage and the ground line with the leading edge timings of the CLK signal leads to the problem that the data signal is erroneously loaded in or inputted to the shift register 1. This is a problem in the conventional driver circuit, which is to be solved by the invention.

SUMMARY OF THE INVENTION

The present invention aims at overcoming the above explained problems in the conventional driver circuit and to provide an improved driver circuit which is capable of preventing malfunctions to be caused by a switching current to flow in transient of changes in outputs.

According to one aspect of the invention, there is provided a driver circuit in an integrated circuit for controlling a plurality of outputs based on an external control signal which is externally supplied and a data signal which is loaded in response to a clock signal, comprising:

a synchronization circuit for producing an internal control signal by causing the external control signal to synchronize with the clock signal; and an output control circuit for controlling the plurality of outputs based on the data signal in accordance with the internal control signal from the synchronization circuit.

According to the present invention, the synchronization circuit produces the internal control signal by synchronizing the externally supplied control signal with the clock signal. Since the internal control signal is thus synchronized with the clock signal, the outputs of the data signal which are controlled in accordance with the internal control signal change with a delay from the timing of the clock signal by a delay time corresponding to a delay which takes place at the synchronization circuit and also the output control circuit. Consequently, a switching current flows in transient of changes in the output signals and, even when noise is produced in signal lines, there is no possibility that the timing of the noise and that of the clock signal overlap each other. Therefore, it is possible to prevent any malfunction caused by a switching current to flow in transient of changes in output signals.

The circuit according to the present invention may include a delay circuit inserted between the synchronization circuit and the output control circuit and, by this delay circuit, the internal control signal can be delayed for a predetermined period of time. By this arrangement, even when the synchronization circuit and the output control circuit are those which operate at such a high speed as to make the delay insufficient, it is possible to ensure the prevention of any overlapping of the noise to be caused by a switching current and the timing of the clock signal.

Further, the external control signal for controlling outputs is sufficiently long in its cycle or duration as compared with that of the clock signal so that, even when the internal control signal is produced by the synchronization of the external control signal with the clock signal, any variations in pulse widths between the BLK signal and the CON signal can be negligible. However, when the clock signal discontinues, there is no need to consider the synchronization between the external control signal and the clock signal. For this purpose, a preferred configuration includes a switching circuit which detects the presence of the clock signal and, during the period in which the clock signal discontinues, supplies the external control signal as it is as the internal control signal to the output control circuit. In this case, there is no variations in pulse widths of the external control signal and the internal control signal.

BRIEF DESCRIPTION OF THE DRAWINGS

The above and other objects, features and advantages of the present invention will be apparent from the following description of preferred embodiments of the invention explained with reference to the accompanying drawings, in which:

FIG. 6 is a timing chart illustrating an operation of the driver circuit of the second embodiment shown in FIG. 5.

DESCRIPTION OF PREFERRED EMBODIMENTS

Now, driver circuits of preferred embodiments of the present invention will be explained hereunder with reference to the accompanying drawings. Throughout the following explanation, similar reference symbols or numerals refer to the same or similar elements in all the figures of the drawings.

Figure 1:
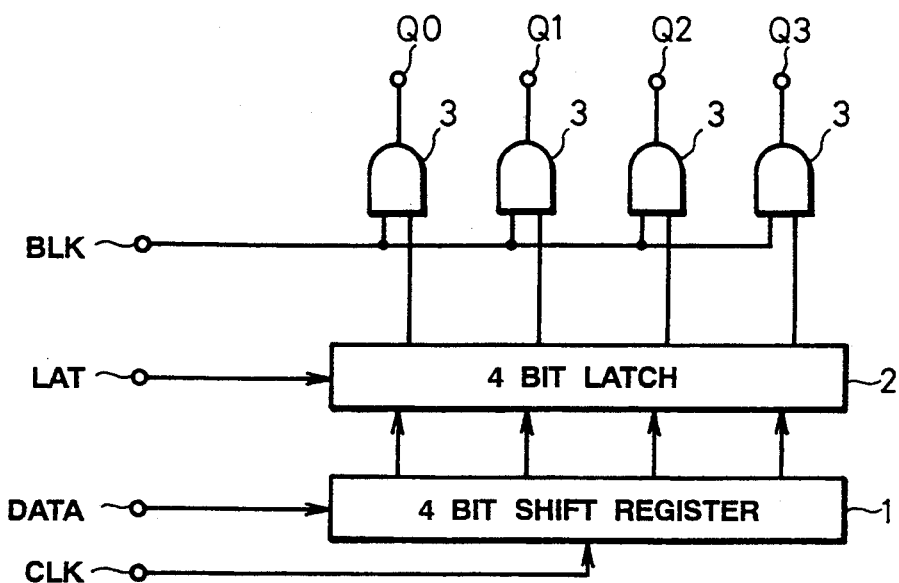
FIG. 1 is a block diagram showing a conventional driver circuit.
Figure 2:
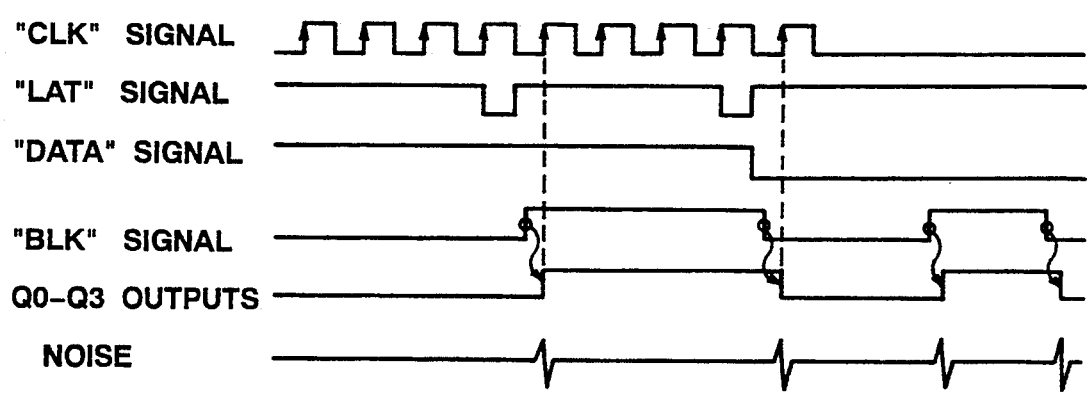
FIG. 2 is a timing chart illustrating an operation of the driver circuit shown in FIG. 1.
Figure 3:
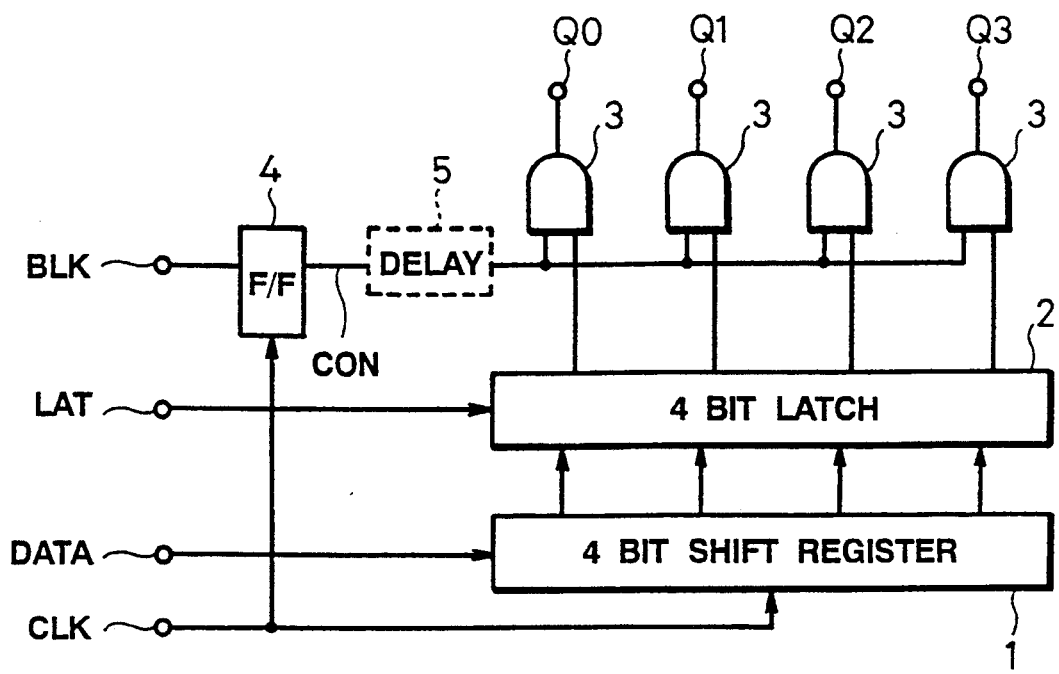
FIG. 3 is a block diagram showing a driver circuit of a first embodiment according to the present invention.

FIG. 3 is a block diagram showing a driver circuit of a first embodiment according to the invention. A 4-bit shift register 1 receives a DATA and CLK signals at its DATA and CLK terminals, respectively, and outputs an output signal of 4-bits in synchronization with the CLK signal. A 4-bit latch 2 receives a LAT signal at its LAT terminal, and latches the output signal from the shift register 1 in response to the LAT signal. A flip-flop 4 which serves as a synchronization circuit receives a BLK signal as an external control signal and also a CLK signal both of which are externally supplied. The flip-flop 4 outputs an internal control Signal (hereinafter referred to as "CON signal") by causing the BLK signal to synchronize with the CLK signal. Each of four AND gates 3 receives at one input terminal the CON signal and at the other input terminal the output signal of the latch 2 and, by performing logical AND operation on the two inputted signals, outputs an output signal at each of the output terminals $Q_0$ through $Q_3$.

Figure 4:
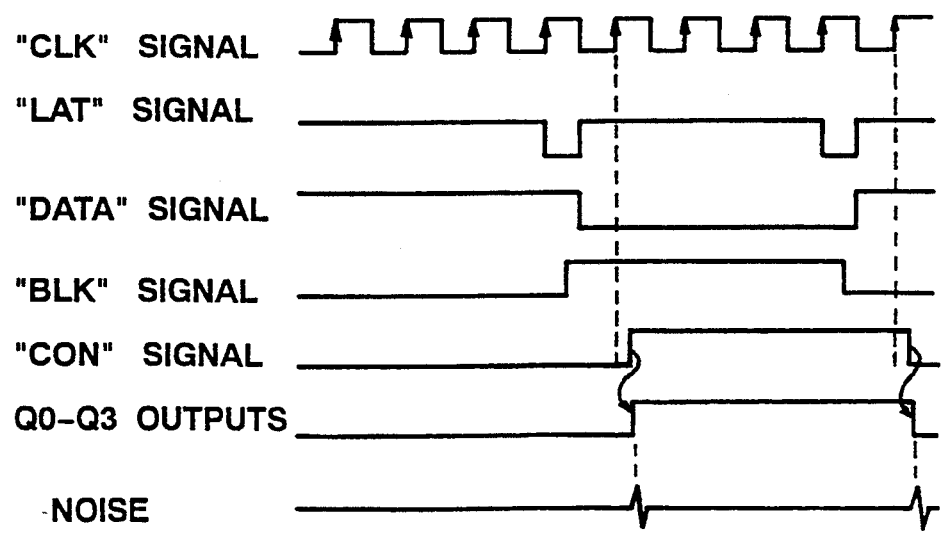
FIG. 4 is a timing chart illustrating an operation of the driver circuit of the first embodiment shown in FIG. 3.

The operation of the driver circuit according to this first embodiment shown in FIG. 3 is explained with reference to a timing chart shown in FIG. 4. The DATA signal serially inputted at the DATA terminal is loaded into the 4-bit shift register 1 in response to leading edges of the CLK signal, and is outputted parallely from all 4 bits of the shift register 1. The output signal of 4-bits outputted from the shift register 1 is then latched by the 4-bit latch 2 when the LAT signal is at "H" and is supplied to each of the AND gates 3 which serve as an output control circuit. The BLK signal supplied for controlling the output control circuit (AND gates 3) changes its level at a timing unrelated to the CLK signal. However, in this embodiment, unlike the conventional driver circuit, the BLK signal is converted by the flip-flop 4 into the CON signal which is synchronized with the CLK signal. When the CON signal is at "L", the AND gates 3 are in their OFF state so that the output signals from the output terminals $Q_0$–$Q_3$ are always kept at "L". On the contrary, when the CON signal turns to "H", the AND gates 3 change to their ON state and, thus, the output signals of the latch 2 are respectively transferred to the output terminals $Q_0$–$Q_3$ through the AND gates 3. In this case, when the CON signal becomes "H", the output signals from the output terminals $Q_0$–$Q_3$ change from "L" to "H" and, when the CON signal becomes "L", the output signals change from "H" to "L".

According to this first embodiment, since the CON signal is synchronized with the CLK signal, the output signals from the output terminals $Q_0$–$Q_3$ actually change with a delay from the timing of the CLK signal, which delay corresponds to an inherent circuitry delay time of the flip-flop 4 and the AND gates 3. Therefore, even when a switching current flows during the transient state of changes in the output signals from the output terminals $Q_0$–$Q_3$ and noise occurs in the signal lines, there is no possibility that the timing of the noise and that of the CLK signal overlap or coincide with each other. Thus, it is possible to prevent the occurrence of malfunction to be caused by a switching current in transient of changes in the output signals and also to prevent the DATA signal from being erroneously loaded into the shift register 1 at any leading edge timing of the CLK signal.

In the arrangement according to this first embodiment, the BLK signal for actually controlling the outputs is sufficiently long in its cycle or duration as compared with that of the CLK signal so that, even when the CON signal is produced due to the synchronization of the BLK signal with the CLK signal, any difference in pulse widths between the BLK signal and the CON signal can be negligible.

As a modification of the above configuration, a delay circuit 5 shown in dotted block in FIG. 3 may be inserted between the output terminal of the flip-flop 4 and the AND gates 3. With such an arrangement, even when the flip-flop 4 and the AND gates 3 operate at high speeds and an inherent delay time is not sufficient, the delay circuit 5 can appropriately control the timing of the CON signal. Consequently, it is possible to ensure the prevention of any overlapping of noise caused by a switching current and the timing of the CLK signal.

Figure 5:
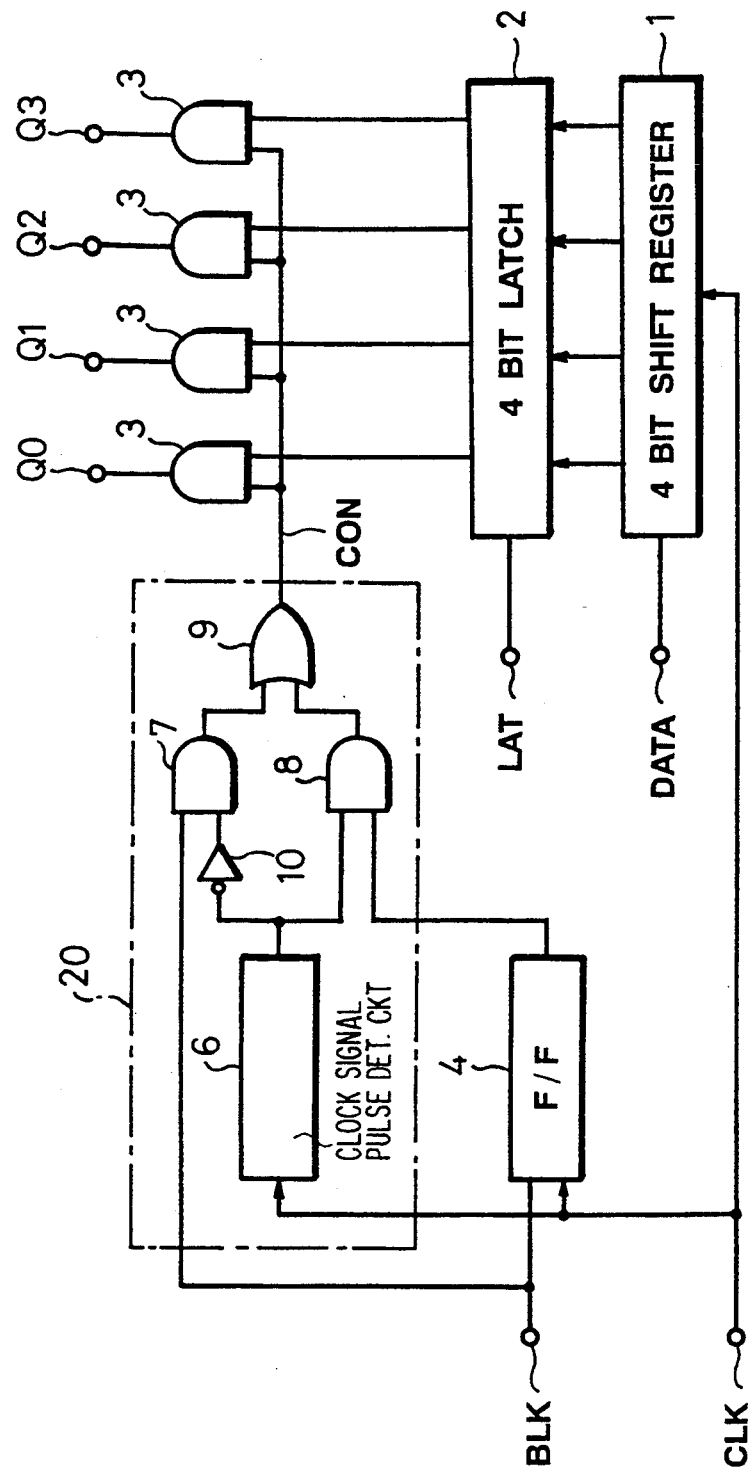
FIG. 5 is a block diagram showing a driver circuit of a second embodiment according to the present invention.

Next, FIG. 5 shows in a block diagram a driver circuit of a second embodiment according to the invention. In this embodiment, a switching circuit for an external control signal is added to the arrangement of the first embodiment so that, in FIG. 5, the same symbols and numerals as in FIG. 3 refer to the same elements and the description of such elements are not repeated herein.

The switching circuit 20 includes a clock detection circuit 6, an inverter 10, two AND gates 7, 8, and an OR gate 9. The clock detection circuit 6 detects the presence of the CLK signal in such a way that it outputs a clock detection signal of "H" during the period in which the CLK signal changes between high and low levels and a clock detection signal of "L" during the period in which the CLK signal is stable at its low level. The AND gate 7 receives at one input terminal the BLK signal and at the other input terminal an output signal of the clock detection circuit 6 through an inverter 10, and outputs a signal after having performed logical AND operation on both the inputted signals. The AND gate 8 receives at one input terminal an output signal of the flip-flop 4 and at the other input terminal the output signal of the clock detection circuit 6, and outputs a signal after having performed logical AND operation on both the inputted signals. The OR gate 9 receives output signals of the AND gates 7 and 8, and outputs a CON signal resulting from logical OR operation between the signals inputted thereto.

Now, the operation of the driver circuit of this second embodiment is explained with reference to FIG. 6 which gives a timing chart. The DATA signal is loaded into the 4-bit shift register 1 in response to the leading edge timings of the CLK signal and is then outputted parallely from all 4-bits of the shift register 1. The output signal of the shift register 1 is latched by the 4-bit latch 2 based on the LAT signal and is then supplied to each of the AND gates 3. Here, the BLK signal changes at a timing unrelated to or independent from the CLK signal but is converted by the flip-flop 4 into a signal which is synchronized with the CLK signal. When the CLK signal changes between high and low levels (in the time period $T_1$), the output signal from the flip-flop 4 is supplied to each of the AND gates 3 as the CON signal based on the output signal of "H" from the clock detection circuit 6. On the other hand, when the CLK signal is stable at its low level (in the time period $T_2$), the BLK signal is supplied as it is to each of the AND gates 3 as the CON signal based on the output signal, which is inverted to "H" by the inverter 10, of "L" from the clock detection circuit 6. While the CON signal is "L", the AND gates 3 are in their OFF state so that the output signals of the output terminals $Q_0$–$Q_3$ are always at "L". When the CON signal becomes "H", the AND gates 3 turn to their ON state and, thus, the output signals of the latch 2 are transferred to the output terminals $Q_0$–$Q_3$ through the respective AND gates 3.

According to this second embodiment, since the CON signal is synchronized with the CLK signal while the CLK signal changes between high and low levels, the output signals from the output terminals $Q_0$–$Q_3$ actually change with a time delay from the timing of the CLK signal, which time delay corresponds to an inherent circuitry delay of the circuits concerned. Therefore, even when a switching current flows in the transient state of changes in the output signals from the output terminals $Q_0$–$Q_3$ and noise occurs in the signal lines, there is no possibility that the timing of the noise and that of the CLK signal overlap each other. Thus, in the same way as in the first embodiment, it is possible to prevent the occurrence of malfunction to be caused by a switching current in transient of changes in the outputs and also to prevent the DATA signal from being erroneously loaded into the shift register 1 at any leading edge of the CLK signal. Further, in the case where the CLK signal is stable at its low level, the BLK signal is supplied as it is as the CON signal so that there is no variation between the pulse width of the BLK signal and that of the CON signal.

Though the above explanation for the embodiments of the invention has been made with respect to a driver circuit having four outputs, it is to be understood that the present invention can be applied to a driver circuit having multi-outputs other than four outputs and thus is not limited to the embodiments described.

As explained hereinabove, according to the present invention, the outputs of the data signal are controlled in accordance with the internal control signal synchronized with the clock signal and, since the synchronization circuit and the output control circuit have inherent circuitry delay times, even if the switching current flows in transient of changes in the outputs and noise occurs in signal lines, there is no possibility that the timing of such noise and that of the clock signal overlap each other. Therefore, it is possible to prevent the occurrence of such malfunction as caused by a switching current which flows in transient of changes in outputs. Thus, the configuration of the driver circuit according to the present invention is particularly suited to a driver circuit with multi-outputs in which the switching current is substantially large.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A driver circuit in an integrated circuit for controlling a plurality of outputs based on an external control signal which is externally supplied and a data signal which is loaded in response to a clock signal, said external control signal being supplied one of independently from and asynchronously with said clock signal, said driver circuit comprising:

a synchronization circuit for synchronizing said external control signal with said clock signal to produce an internal control signal;

an output control circuit for providing output signals at said plurality of outputs based on said data signal in accordance with said internal control signal from said synchronization circuit such that said output signals change with a delay with respect to timing of said clock signal, said delay corresponding to an inherent circuitry delay time of said synchronization circuit and said output control circuit; and a switching circuit for detecting changes in levels of said clock signal and, during a period in which said clock signal is stable at a low level, supplying said external control signal to said output control circuit as said internal control signal.

2. A driver circuit according to claim 1, wherein said switching circuit comprises:

a clock detection circuit for detecting said changes in levels of said clock signal;

an inverter for inverting an output signal of said clock detection circuit;

a first AND gate for receiving an output of said inverter and said external control signal;

a second AND gate for receiving said output signal from said clock detection circuit and said internal control signal from said synchronization circuit; and an OR gate for receiving output signals from said first and second AND gates.

3. A driver circuit in an integrated circuit for controlling a plurality of outputs based on an external control signal which is externally supplied and a data signal which is loaded in response to a clock signal, comprising:
- a synchronization circuit for synchronizing said external control signal with said clock signal to produce an internal control signal;
- an output control circuit for controlling said plurality of outputs based on said data signal in accordance with said internal control signal from said synchronization circuit; and
- a switching circuit for detecting changes in levels of said clock signal and, during a period in which said clock signal is stable at a low level, supplying said external control signal to said output control circuit as said internal control signal, said switching circuit comprising:
- a clock detection circuit for detecting said changes in levels of said clock signal;
- an inverter for inverting an output signal of said clock detection circuit;
- a first AND gate for receiving an output of said inverter and said external control signal;
- a second AND gate for receiving said output signal from said clock detection circuit and said internal control signal from said synchronization circuit; and
- an OR gate for receiving output signals from said first and second AND gates.

* * * * *